United States Patent [19]
Heitmann

[11] 4,264,865
[45] * Apr. 28, 1981

[54] METHOD OF DELAYING DIGITAL SIGNALS

[75] Inventor: Jürgen Heitmann, Seeheim, Fed. Rep. of Germany

[73] Assignee: Robert Bosch GmbH, Stuttgart, Fed. Rep. of Germany

[*] Notice: The portion of the term of this patent subsequent to Mar. 6, 1996, has been disclaimed.

[21] Appl. No.: 947,558

[22] Filed: Oct. 2, 1978

Related U.S. Application Data

[63] Continuation-in-part of Ser. No. 808,691, Jun. 27, 1977, Pat. No. 4,143,326.

[30] Foreign Application Priority Data

Jun. 22, 1976 [DE] Fed. Rep. of Germany ....... 2627830

[51] Int. Cl.³ .................... H03K 5/159; H03K 21/36
[52] U.S. Cl. ........................................ 328/55; 328/37; 328/48; 235/92 SH
[58] Field of Search .......................... 328/37, 48, 55; 235/92 SH

[56] References Cited
U.S. PATENT DOCUMENTS

| | | |
|---|---|---|
| 3,044,065 | 7/1962 | Barney et al. ............... 328/48 X |
| 3,096,483 | 7/1963 | Ransom ..................... 328/48 |
| 3,588,707 | 6/1971 | Manship .................... 328/55 |
| 3,675,049 | 7/1972 | Haven ...................... 328/55 X |
| 3,851,154 | 11/1974 | Beecham .................. 235/92 SH |
| 3,941,982 | 3/1976 | Knollenberg et al. ........ 235/92 SH |

*Primary Examiner*—John S. Heyman
*Attorney, Agent, or Firm*—Quaintance, Murphy & Richardson

[57] ABSTRACT

A method of delaying a signal N period lengths of a timing signal is disclosed using two shift registers which have capacities y and z, each less than N, but which have a total capacity greater than N. The signal to be delayed is fed to a first shift register until that shift register is full. The signal is later fed to the second shift register. When N bits of information have been recorded by the shift registers, the first shift register is again inputted causing an output which corresponds to the first data bits of the signal. Thus, there is stored in both registers y+z—N bits of common data during each cycle. This cycle is repeated for each N periods of the timing signal, thereby resulting in the storage of N data bits by a plurality of shift registers which each have a capacity less than N which have a total capacity greater than N.

10 Claims, 4 Drawing Figures

METHOD OF DELAYING DIGITAL SIGNALS

CROSS-REFERENCE TO RELATED APPLICATION

This application is a Continuation-in-Part of Ser. No. 808,691, filed June 22, 1977, now U.S. Pat. No. 4,143,326.

BACKGROUND OF THE INVENTION

1. Field of the Invention

The invention generally relates to signal delay systems which are used to delay a signal for N period lengths and, more specifically, to signal delay systems which employ the use of integrated circuit shift registers yet which require total capacities which do not correspond to binary steps.

2. Description of the Prior Art

The use of shift registers to delay signals is well known. The delay time which can be achieved with a shift register is dependent on the frequency of the timing signal and the specific number of register elements of the shift register being used. Since the frequency of the timing signal is usually specified beforehand in general transmission systems, a set delay time can be realized only by a shift register with a corresponding number of register elements. However, moderately priced shift registers of integrated circuit designs are predominantly offered in shift register element numbers in binary steps ($2^n$).

From Beecham U.S. Pat. No. 3,851,154, it is known to delay a digital signal by arranging two such shift registers in parallel and input alternate bits of the signal into each register. In order that the delayed signal be properly merged again at the outputs of the shift registers, it is necessary that the registers each have the same number of stages, i.e., S, in which case the signal is delayed by $2S-1$ periods of the timing signal. Assuming that registers are only available in binary steps, i.e., $S = 2^n$ ($n = 1, 2, 3, \ldots$) the delay of the input signal by an arbitrary time period is not possible by using the methods taught by Beecham.

Other attempts at digital signal delay with the aid of two or more shift registers in parallel are known but none satisfy the objects of the present invention. Other examples of the prior art are Manship U.S. Pat. No. 3,588,707, Haven U.S. Pat. No. 3,675,049, and Knollenberg et al U.S. Pat. No. 3,941,982.

It is an object of this invention to provide a signal delay system that has the advantage of a shift register with a function of an arbitrary number of register elements using commercially available integrated circuits. It is a further object of this invention to provide a signal delay system particularly well suited to the delay of digitalized video signals. It is yet another object of this invention to provide shift registers with length of several thousands of bits such as those which fall in the binary gradation between $2^{10}$ and $2^{13}$.

SUMMARY OF THE INVENTION

In the present invention, two shift registers are used to delay a digital signal N period lengths, the capacity of each shift register being less than N with the total capacity of both shift registers being greater than N. The digital signal to be delayed is fed simultaneously to the first and the second shift registers but the receipt of the signal and its data bits by the shift registers is selectively controlled by a control signal derived from a timing signal which is inputted to the shift registers. Generally, the data bits of the digital signal are fed first to the first shift register until that shift register is full and to the second shift register until that shift register is full. This cycle is repeated each N periods of the timing signal. Thus, during the storage of data bits into the first shift register, the required number of data bits necessary to fill the second shift register are stored in the second register, there being a common storage in both registers of some data bits. By selecting the output of each shift register at the proper time, the delayed signal can be received in proper sequence.

Any of several possible optimum output selection sequences can be employed which can ensure the desired delay regardless of the capacity of the two shift registers employed so long as they are within the constraints mentioned above. The output selection sequences are typically coincident with or anti-coincident with the initiation or termination of entry of information into one or both of the shift registers employed. Other features of the inventive method will become apparent from a consideration of the accompanying drawings together with the following description of preferred embodiments.

DESCRIPTION OF THE PREFERRED EMBODIMENT

Figure 1:
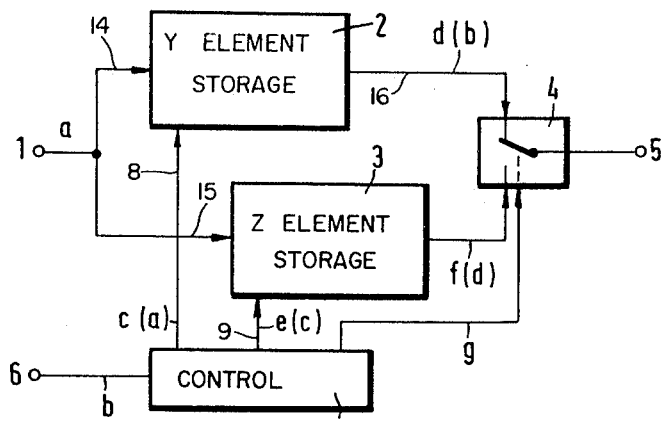
FIG. 1 is a block diagram of a signal delay system employing the inventive method.
Figure 2:
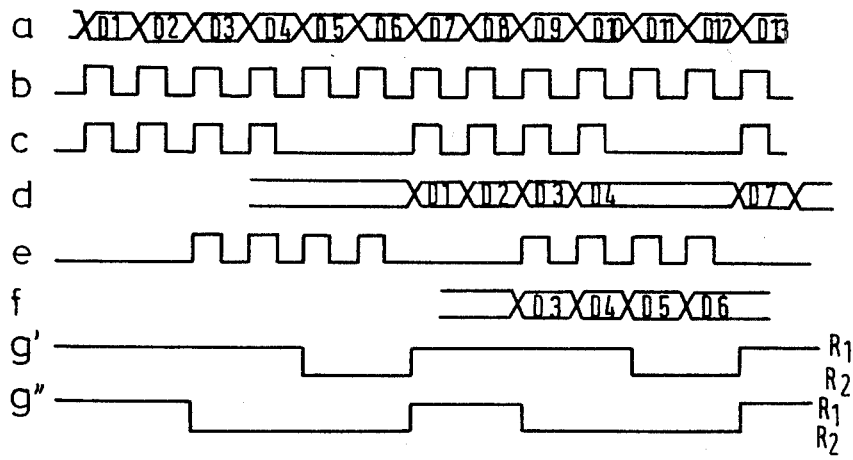
FIGS. 2 and 3 are time-sequenced diagrams of the various control circuitry shown in FIG. 1 wherein the upper portion of the step functions represent the "on" condition and the lower portions represent the "off" conditon.

In the block diagram of FIG. 1, a signal having frequency f which is to be delayed, shown in FIG. 2 by line 2a, is fed via terminal 1 to a first shift register 2 and to a second shift register 3. The outputs of the two shift registers, 2 and 3, are connected to a control changeover switch 4 from the output of which a delayed signal is provided at terminal 5. The timing of the delayed signal is provided at terminal 6. The control of the two shift registers 2 and 3 is accomplished by control signals 8 and 9.

Assume that it is required to delay a signal N period lengths. Further, assume that two shift registers are readily available, the first shift register 2 has a capacity y and the second shift register 3 has a capacity z. Generally, y and z must each be less than N but must total greater than N. For simplicity, assume y is equal to or greater than z.

The storage of the signal is controlled by control 7 which inputs control signal 8 to shift register 2 and control signal 9 to shift register 3. The control signals are structured to produce the following result. The data of the digital signal is first inputted into only shift register 2 until $N-z$ data bits have been stored. At that time the signal is simultaneously inputted into shift register 2 and shift register 3. This condition continues until shift register 2 reaches capacity at which time the control signal 8 inhibits input 14 and shift register 2 no longer receives any data. The digital signal continues to be stored by shift register 3 until it reaches capacity at which time this cycle is repeated. It is to be noted that this results in a dual storage of y−(N−z) data bits. By selecting the proper time sequence of the outputs of shift registers, the properly delayed sequenced signal can be received. Specifically, during a given cycle the first N−z data bits are read by switch 4 from shift register 2 and the remaining z data bits are read from shift register 3. Alternatively, the first y data bits can be read by switch 4 from shift register 2 and the remaining N−y data bits can be read from shift register 3. Many varations are possible since both shift registers mutually store z+y−N data bits and either shift register can be utilized by control 7 to provide these data bits through switch 4. A further discussion of other variations is to be found in the examples of operation which follow.

Figure 4:
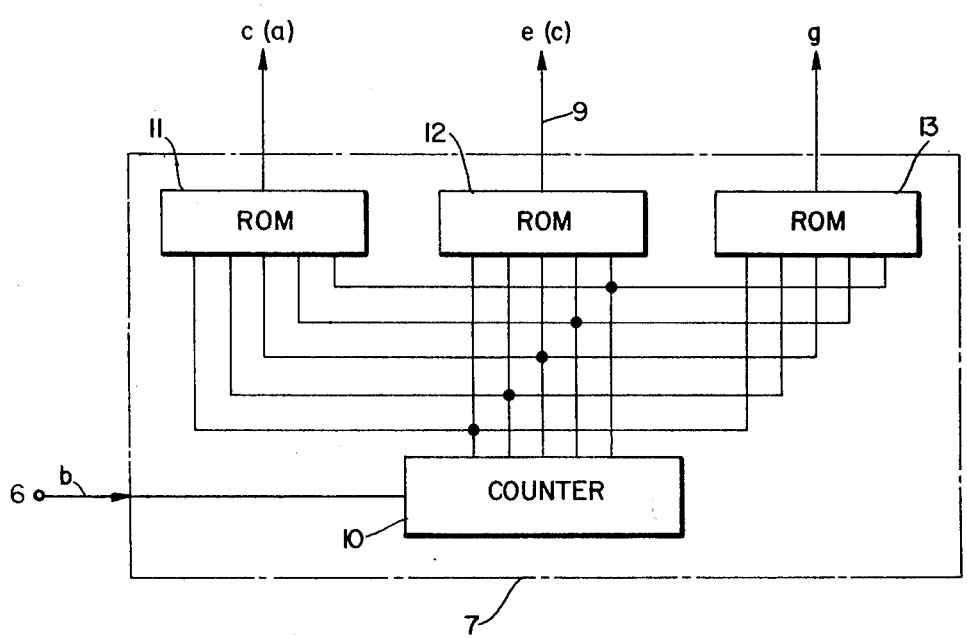
FIG. 4 is a block diagram of one embodiment of the control shown in FIG. 1.

FIG. 4 is a block diagram for a possible form of a control switch 7. Additionally, the control switch 7 contains a counter 10 and a logical switching network consisting of constant storage units 11, 12 and 13. The timing signal such as a horizontal impulse signal b is directed serially to the counter 10 at terminal 6. The counter 10 sorts or selects parallelly. At the exit of counter 10 only parallel present binary values are logically switched into the constant storage units 11, 12 and 13. Constant storage units of this type can, for example, be Read Only Memories (ROM).

EXAMPLE OF OPERATION

Assume for the explanation of the manner of operation that the digital signal present at terminal 1 (line 2a) is to be delayed by six period lengths of the timing signal (line 2b) present at terminal 6 having frequency f. This delay would be realized in a simple manner with one shift register with six register elements. As mentioned at the outset, however, shift registers are usually offered only in register element numbers which come in binary steps, i.e., $S=2^n$. For the case of a delay of N=6 periods of the specified timing signal (line 2b), the number of register elements, y, of the first shift register 2, was taken as $2^2$, and the number of register elements, z, of the second shift register 3, was likewise chosen as $2^2$. Unlike some prior art it is not necessary that y=z and the choice here made is only for simplicity and convenience.

In one example of a time sequence of the control circuitry 7, based on FIG. 2, the digital signal at input 1 (Line 2a) is first placed in the first shift register 2 at input 14 with four timing pulses at timing input 8 (Line 2c). The upper line (Line 2a) of FIG. 2 represents the signal of a data sequence at terminal 1. The numeration of this data sequence serves for a better understanding of the specific timewise position of a signal placed in registers 2 and 3. As can be seen from FIG. 2, the control signal (Line 2c) for the first shift register 2, is blanked after a sequence of four timing pulses, i.e., the first shift register is inhibited when it reaches capacity. Following the second timing pulse for the first shift register 2, the second shift register 3 is also triggered. Likewise, with four timing pulses (Line 2e) at timing input 9, the signal a appearing at input 1 is placed in shift register 3 by input 15. After a sequence of four timing periods, the second register 3 is also cut off. At this moment which corresponds to 6 periods of the timing signal (Line 2b), registers 2 and 3 are fully loaded.

During the next four timing periods, the inhibiting of the timing signal (Line 2c) for the first shift register 2 is lifted and the digital signal read into the first shift register 2 is read out at output 16 providing at terminal 5 the output signal (Line 2d) via the contact path of the controlled changeover switch 4. The controlled switch 4 is controlled by a controlling signal (Lines 2g). Following the fourth timing pulse, the timing signal (Line 2c) for the first shift register 2 is again inhibited. Simultaneously, the contact path of the controlled changeover switch 4 is connected to the output of the second shift register 3 by means of control 7 with the control signal (Line 2g') for the duration of two timing pulses providing the output signal (Line 2f). Thereafter, a new control sequence begins through control circuit 7. In this example the output control (Line 2g') can be considered to be coincident with data entry into the first shift register.

In another embodiment, controlled switch 4 is controlled by controlling signal (Line 2g'') such that the contact path for the controlled changeover switch 4 is connected to the output of the first shift register 2 for the duration of the first two timing pulses. Following the second timing pulse, the contact path of the controlled changeover switch 4 is switched over for the duration of four timing pulses. This variation of the control sequence also repeats itself following six timing periods of the timing periods of the timing signal at terminal 6. In this embodiment the output control (Line 2g'') can be considered to be coincident with data entry into the second shift register.

The control signals pictured in Lines 2g' and 2g'' place the contact path of the controlled changeover switch 4 at the output of the first shift register 2 for the case of a high level $R_1$ and for a lower level $R_2$, connect it to the output of the second shift register 3. The signals pictured in Lines 2d and 2f are the output signals of shift registers 2 and 3 respectively.

Figure 3:
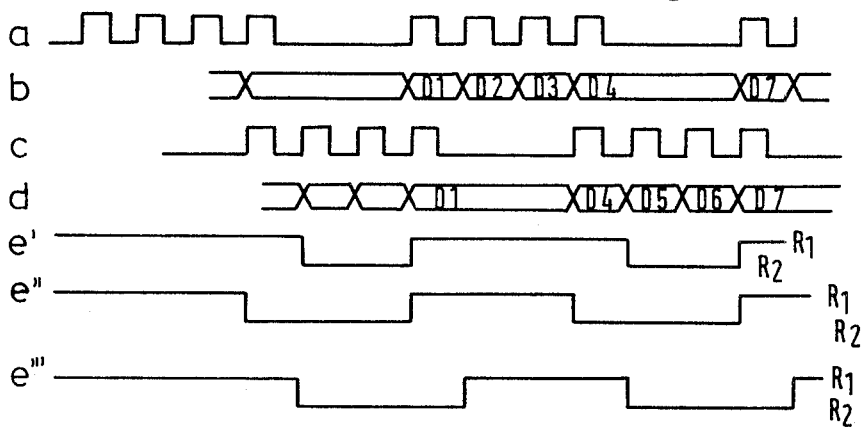

In another embodiment illustrated with variations in FIG. 3, the inhibiting of data entry into shift registers 2 and 3 is shown in Lines 3a and 3c respectively. While Line 3a is the same sequence as shown in Line 2c, the control for data entry into register 3 has been shifted as can be seen by comparing Lines 3c and 2e. Despite this shift in relationships in the data input control signals, there is still a common or simultaneous entry of z+y−N bits of data into both shift registers during each N periods of the timing signal (Line 2b). The time sequence control of the controlled switch 4 can be determined by any one of the controlling signals (Lines 3e', 3e'', or 3e'''). The control signal, Line 3e', can be considered as coincident with data entry into the first shift register 2 similar to Line 2g'. The control signal, Line 3e'', can be considered coincident with the initiation of data entry into each of the shift registers, respectively. The control signal, Line 3e''', can be considered as anti-coincident with the termination of data entry into each shift register, respectively.

An inhibiting or blanking of data entry can be accomplished most expediently in control circuit 7 shown in detail in FIG. 4 by counting the timing pulses appearing at terminal 6. Using logic elements, for example, by means of fixed value memories 11 and 12, the two gated timing signals (Lines 2c and 2e, or Lines 3a and 3c) can be taken off for shift registers 2 and 3. Similarly, the control signal (Line 2g or Line 3e) can be provided by fixed value memory 13 for controlled changeover switch 4. Other appropriate control means can be employed in the practice of this invention. The methods herein disclosed are not only applicable to digital shift registers, but also can employ analog shift registers, for example, bucket brigade circuits and charge coupled storage chains. Other variations and modifications of the delay sequences herein disclosed may exist which are within the spirit and scope of the present invention as defined by the appended claims.

What is claimed is:

1. A method of delaying a digital signal for N periods of a timing signal comprising the steps of:
   (a) providing first and second shift registers each having a capacity less than N, the sum of the capacities of the two shift registers being greater than N,
   (b) feeding the digital signal in parallel to an input of both shift registers,
   (c) inhibiting the entry of the digital signal into the first shift register after y periods of a timing signal where y is the capacity of the first shift register,
   (d) permitting the entry of the digital signal to the second shift register for z periods where z is the capacity of the second shift register and thereafter inhibiting the entry of the digital signal thereinto,
   (e) repeating the steps (c) and (d) thereby storing in both shift registers simultaneously $y+z-N$ bits for each N periods of the timing signal, and
   (f) withdrawing the delayed digital signal from the outputs of both shift registers.

2. The method of claim 1 wherein step (f) further comprises the steps of:
   (i) providing a controlled switch having an output and two inputs each of which is connected to the output of one of the two shift registers, and
   (ii) controlling the controlled switch with a controlling signal derived from said timing signal.

3. The method of claim 2 wherein step (ii) comprises the step of providing a controlling signal which causes the signal output of the shift registers to be transferred to the controlled switch output in a pattern coincident with data entry into the first shift register.

4. The method of claim 2 wherein step (ii) comprises the step of providing a controlling signal which causes the signal output of the shift registers to be transferred to the controlled switch output in a pattern coincident with data entry into the second shift register.

5. The method of claim 1 further characterized by initiating step (d) prior to $y-1$ periods of the timing signal.

6. The method of claim 5 wherein step (f) further comprises the steps of:
   (i) providing a controlled switch having an output and two inputs each of which is connected to the output of one of the two shift registers, and
   (ii) controlling the controlled switch with a controlling signal derived from said timing signal.

7. The method of claim 6 wherein step (ii) comprises the steps of providing a controlling signal which causes the signal output of the shift registers to be transferred to the control switch output in a pattern coincident with data entry into the first shift register.

8. The method of claim 6 wherein step (ii) comprises the step of providing a controlling signal which causes the signal output of the shift registers to be transferred to the controlled switch output in a pattern coincident with the initiation of entry of digital information into each of the shift registers respectively.

9. The method of claim 6 wherein step (ii) comprises the step of providing a controlling signal which causes the signal output of the shift registers to be transferred to the controlled switch output in a pattern anti-coincidental with the termination of data entry into each of the shift registers respectively.

10. A method of delaying a digital signal for N periods of a timing signal of frequency f comprising the steps of:
    (a) providing first and second shift registers each having a capacity less than N, the sum of the capacities of the two shift registers being greater than N,
    (b) feeding the digital signal in parallel to an input of both shift registers,
    (c) inhibiting the entry of the digital signal into the first of the shift registers after y periods of the timing signal where y is the capacity of the first shift register,
    (d) permitting the entry of the digital signal to the second shift register for z additional periods where z is the capacity of the second shift register, and thereafter inhibiting the entry of the digital signal thereinto,
    (e) repeating the steps (c) and (d) thereby storing in both shift registers simultaneously $y+z-N$ bits for each N periods of the timing signal,
    (f) providing a controlled switch having an output of one of the two shift registers, and
    (g) deriving from the timing signal a controlling signal for controlling the controlled switch whereby the signal output of the shift registers is transferred to the controlled switch output in such a pattern as to reproduce the input digital signal delayed by N periods of a timing signal.

* * * * *